United States Patent [19]

Uehara

[11] Patent Number: 5,262,671
[45] Date of Patent: Nov. 16, 1993

[54] SEMICONDUCTOR DEVICE IN WHICH A PERIPHERAL POTENTIAL BARRIER IS ESTABLISHED

[75] Inventor: Masamichi Uehara, Suwa, Japan

[73] Assignee: Seiko Epson Corporation, Tokyo, Japan

[21] Appl. No.: 784,190

[22] Filed: Oct. 29, 1991

[30] Foreign Application Priority Data

Oct. 20, 1990 [JP] Japan .................................. 2-291253
Sep. 29, 1991 [JP] Japan .................................. 3-240665
Oct. 29, 1991 [JP] Japan .................................. 3-282934

[51] Int. Cl.$^5$ .......................................... H01L 29/40
[52] U.S. Cl. .................................... 257/630; 257/659; 257/629
[58] Field of Search ........................ 257/629, 630, 659

[56] References Cited

U.S. PATENT DOCUMENTS

| 4,364,078 | 12/1982 | Smith et al. | 257/630 |
| 4,583,109 | 4/1986 | Goetz | 257/630 |
| 4,835,592 | 5/1989 | Zommer | 257/630 |

Primary Examiner—Gene M. Munson
Attorney, Agent, or Firm—Spensley Horn Jubas & Lubitz

[57] ABSTRACT

In a semiconductor device which includes a substrate having a peripheral edge, and a semiconductor integrated circuit fabricated on the substrate so that the circuit has an outer periphery spaced inwardly of the peripheral edge of the substrate, a conductive layer is provided to extend along at least a part of the outer periphery of the circuit and between the outer periphery of the circuit and peripheral edge of the substrate, or the conductive layer is disposed close to metal electrodes provided on the substrate for connection to the integrated circuit, and a potential is applied to the conductive layer and to the substrate to create at the conductive layer a potential barrier maintained at a potential higher than the potential of the substrate.

24 Claims, 2 Drawing Sheets

SEMICONDUCTOR DEVICE IN WHICH A PERIPHERAL POTENTIAL BARRIER IS ESTABLISHED

BACKGROUND OF THE INVENTION

The present invention relates to improvements in semiconductor devices and, more particularly, to arrangements for preventing leakage paths from forming between metal electrodes or the like and for preventing deterioration in the characteristics and corrosion of semiconductor device.

In the fabrication of semiconductor devices, it is known to form passivation films on device surfaces to improve and stabilize their characteristics, to suppress long term variations and to achieve high reliability. To form such passivation films and to protect the semiconductor devices from external contamination, various techniques are used. In order to prevent metal electrodes and metal interconnects formed on semiconductor substrates from being corroded by moisture or other matter entering from the outside, it is known to form a passivation film of phosphosilicate glass (PSG) or the like to prevent intrusion of moisture after the interconnects or electrodes have been formed.

In known devices of this type, leakage paths may appear, and will cause difficulties the semiconductor device is placed into operation or after it has been in operation for a long time. In particular, after a semiconductor device has been used for a long term, thermal distortion takes place. Also, when a semiconductor device is mounted, stresses occur. In these and other cases, a gap can appear between the passivation film and the molding resin in which the device is encapsulated. Moisture enters the gap, thus creating a current leakage path.

FIGS. 3 and 4 show a semiconductor device according to the prior art having components formed on a chip 10 which is composed of a substrate 1 cut from a wafer along scribe lines 7. The device includes a passivation film 3 which, in the completed device, will be covered by a layer or body of molded resin (not shown). For reasons outlined above, a gap may appear between film 3 and the molded resin and it has been found that leakage paths 13 are often produced by moisture or mobile ions permeating any contaminant that fills in the gap at the interface between passivation film (or overcoat film) 3 formed on the semiconductor device, or chip, 10 and the molded resin formed on passivation film 3. The aforementioned gap is quite narrow and easily formed by thermal distortion produced during operation of the chip or by stress produced during installation. More specifically, in this case, the electrode plate 6 or the metal forming a bump 5 of an electrode 4 which is at a higher potential than one chip edge 7 is ionized. The resultant ions move toward the chip edge 7 that is at a lower potential.

It is considered that leakage paths 13 are formed between the electrodes 4 at the higher potential and the chip edge 7 at the lower potential or between electrodes 4 at higher potential and electrodes 4 at lower potential. Such leakage paths 13 are frequently produced in the electrodes to which high voltages are applied and between power supply electrodes conducting high electric current densities. Leakage paths 13 deteriorate the characteristics of IC chip 10 and induce malfunctions. Electric currents flowing through the leakage paths erode the electrodes 4 and other components, thus impairing the long-term reliability of the device. Especially, progress of corrosion of electrodes of aluminum is a well-known problem and opens the bonded part.

SUMMARY OF THE INVENTION

In light of the foregoing problems, the present invention provides highly reliable semiconductor devices constructed to prevent the appearance of leakage paths that would normally deteriorate the characteristics of the device, impair long-term reliability, delaminate the bond between the passivation film and the molded resin, and cause other problems.

In order to solve the foregoing problems in accordance with the present invention, a conductive layer capable of impeding movement of metal ions is disposed at the peripheral portion of the circuit of a device in which a leakage path is easily formed, especially outside of metal electrodes and/or between the metal electrodes.

Specifically, in a semiconductor device comprising a substrate and a semiconductor integrated circuit built on the substrate, in accordance with the invention, the conductive layer for creating a potential barrier is disposed along at least a part of the outer periphery of the circuit and between the outer periphery of the circuit and the periphery of the substrate, the barrier being kept at a potential higher than the potential of the substrate.

A semiconductor device having metal electrodes formed along the edges of the substrate is characterized in that a conductive layer for creating a potential barrier maintained at a higher potential than on the substrate is disposed close to at least some of the metal electrodes. Preferably, the conductive layer is arranged between the metal electrodes and the edges of the substrate and/or between the metal electrodes. Also, placement of the conductive layer relative to the metal electrodes to which a DC voltage is applied is effective.

Preferably, the conductive layer is connected via a connecting means with a high-voltage power supply for the semiconductor integrated circuit built on the substrate. Advantageously, the connecting means comprises either nonmetallic interconnects which connect the high-voltage power supply with the conductive layer or a high resistive means which connects the high-voltage power supply with the conductive layer. The connecting means can be formed from a polysilicon layer formed on the substrate or a layer in which an impurity is diffused.

Preferably, the conductive layer consists of conductive belts. This conductive layer can be formed by the use of aluminum interconnects formed on the semiconductor substrate, the polysilicon layer, or the layer in which an impurity is diffused.

Where a leakage path runs from metal electrodes or the like, movement of electric charge is considered to be caused by metal ions. These metal ions are positive ions. Thus, a potential barrier is created by forming a conductive layer of a high potential between the metal electrodes and the substrate or other electrodes that are at a low potential. As a result, movement of the effluent metal ions is impeded. That is, moisture adheres to the surface of the metal electrode to form a potential gradient which decreases from the surface toward the substrate. However, the potential barrier located in the gradient creates a potential well between the metal electrode and the conductive layer. The metal ions are trapped in the well.

Therefore, a high potential is applied to the semiconductor integrated circuit formed on the substrate, especially to metal electrodes which are often formed along the border of the circuit. If moisture arrives at the metal interconnects or metal electrodes in this circuit for some reason or other, and if the metal is ionized, movement of the ions is prevented by the above-described conductive layer. In this way, formation of a leakage path is prevented. Especially, in electrodes to which a DC voltage is applied, metal tends to erode away from the electrodes. In this case, formation of a potential barrier around these electrodes by the conductive layer is effective.

It is a necessary to maintain the potential at the conductive layer as high as possible to prevent the appearance of leakage paths. This is attained by connection with a high-voltage power supply for the semiconductor integrated circuit built on the substrate. If nonmetallic interconnects which adhere well to the substrate are used for the connection to the power supply, then intrusion of moisture along the conductive layer is prevented. In this case, the circuit fabricated on the substrate is not affected by moisture even if cracks reach the conductive layer and if the conductive layer is eroded. it substantially follows that the conductive layer prevents moisture from entering the cracks, Also, the conductive layer serves substantially as a sacrificial electrode against corrosion. Where moisture enters the conductive layer, electric current leaking from the conductive layer can be suppressed by connecting the conductive layer to the high-voltage power supply via a high resistance.

Metal ions that flow out of the metal electrodes or the like are trapped in the above-described potential well. To prevent these metal ions from flowing out of the well, the conductive layer is shaped into the form of belts. This increases the width of the potential barrier forming the well, which is effective in preventing the metal ions from flowing out of the well.

DESCRIPTION OF THE PREFERRED EMBODIMENTS

An embodiment of the invention is hereinafter described with reference to FIGS. 1 and 2.

Figure 1:
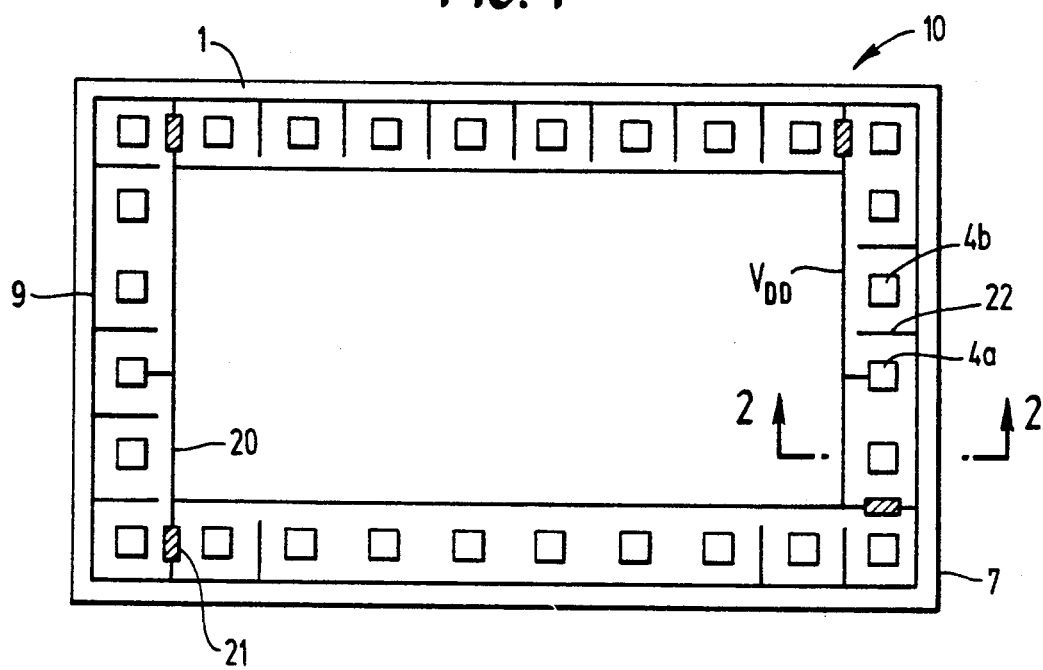
FIG. 1 is a plan view showing a preferred embodiment of a semiconductor device according to the present invention.
Figure 2:
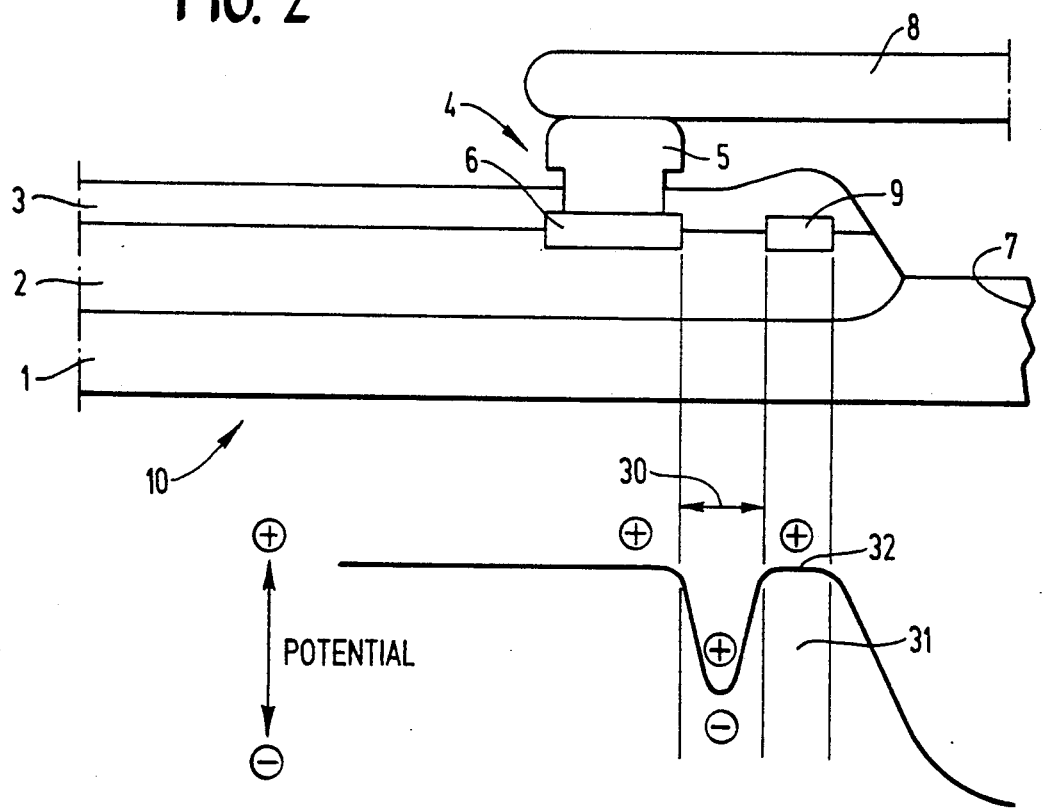
FIG. 2 is a cross-sectional view in the vicinity of one electrode of the semiconductor device, taken along line 2—2 of FIG. 1.
Figure 3:
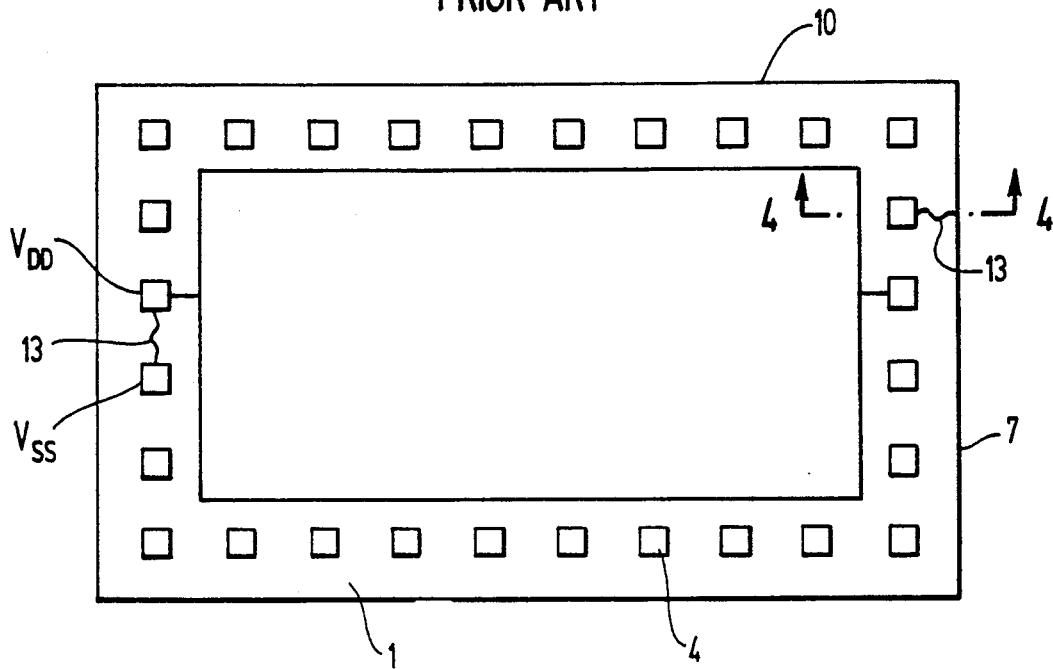
FIG. 3 is a view similar to that of FIG. 1 showing a prior art semiconductor device.
Figure 4:
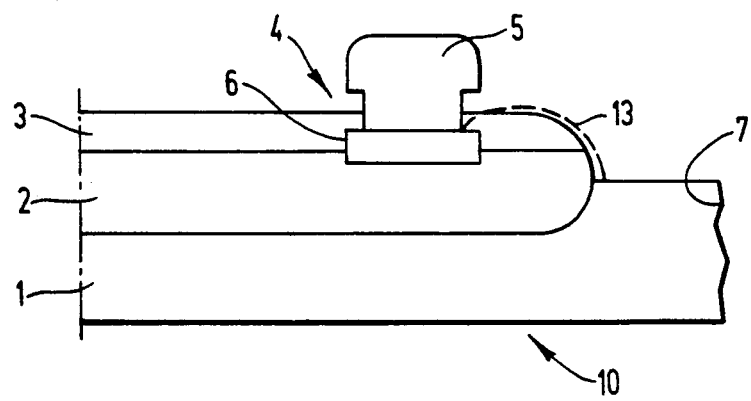
FIG. 4 is a cross-sectional view taken along the line 4—4 of FIG. 3.

Referring to FIGS. 1 and 2, there is shown an embodiment of a semiconductor device on which a conductive layer is formed. In the present embodiment, integrated circuit device or chip 10 has electrodes 4 arranged around a circuit (not shown) fabricated in the region of substrate 1 which is surrounded by electrodes 4. The periphery of substrate 1 on which the electrodes are arranged is scribed at 7 to form the substantially rectangular chip 10. High-voltage interconnects 20 of aluminum for supplying a high voltage Vdd to the circuit (not shown) are disposed inside the array of electrodes 4. The interconnects 20 are connected to a power supply electrode 4a. Aluminum interconnects 9 acting as conductive belts are disposed along the periphery of the chip 10 between the electrodes 4 and the scribed chip edges 7, i.e. outside the region enclosed by electrodes 4. The interconnects 9 are connected with the power supply interconnects 20 at each corner of chip 10, the interconnects 20 being disposed to the inside of electrodes 4.

Polysilicon layer regions 21 having a high resistance are provided at the corners of chip 10 for connecting together aluminum interconnects 9 and 20. Branch lines 22 extend from interconnects 9 into spaces between adjacent electrodes 4, the interconnects 9 being arranged to surround the electrodes 4. In this way, conductive belts are formed between the high-voltage power supply electrodes 4a and the low-voltage power supply electrodes 4b. Similarly, with respect to other electrodes, branch lines 22 extending from interconnects 9 are disposed between high-voltage electrodes and neighboring low-voltage electrodes.

FIG. 2 shows the cross section of the above-described device adjacent an edge 7 of chip 10. The edge region of this chip 10 is similar to that of the prior art chip 10 described previously in that a field oxide film 2 is formed on silicon substrate 1 of p type. The film 2 is an insulating film formed of silicon oxide. Each electrode 4 is created by forming an aluminum pad electrode 6 on field oxide film 2 and a gold bump 5 on the electrode 6 with layer of a metal such as chromium, zinc, or titanium which forms a barrier with the pad electrode 6, interposed between electrode 6 and bump 5. External metal leads or fingers 8 are connected to bumps 5 to supply and receive input and output signals to and from the circuit in the chip 10 and to supply electric power to the circuit. The electrodes 4 and the metal leads 8 may be metal leads formed by wire bonding. The surface of the chip 10 is coated with an overcoat, or passivation, film 3 to protect these electrodes 4 and the field oxide film 2.

It should be noted that in the chip 10 shown in FIGS. 1 and 2, the belt-like aluminum interconnects 9, which are conductive belts for creating a potential barrier, are disposed between the field oxide film 2 and the overcoat film 3, in the same way as the pad electrodes 6. The potential gradient established with this cross section is shown in the lower part of FIG. 2.

Where a high potential is applied to the illustrated electrode 4, the substrate 1 is normally retained at a low potential and so in the prior art semiconductor device, if moisture adheres to the chip surface so as to bridge the gap between the electrode 4 and also to the chip edge, a potential gradient decreasing from the electrode 4 toward the chip edge is created. This potential gradient will induce a flow of metal ions from the pad electrode 6 forming the electrode 4, from the barrier layer and from the bump 5. That is, an electric current flows, thus establishing a leakage path. This can, in prior art devices, cause corrosion and other problems.

On the other hand, according to the present invention, the aluminum interconnects 9 connected with the high-voltage interconnects 20 are arranged around the electrodes 4. Therefore, a potential well 30 is created by the aluminum interconnects 9. That is, since the aluminum interconnects 9 are kept at a high potential, a potential barrier 31 that is maintained at a high potential is formed between the electrodes 4 and the chip edges.

This barrier 31 confines the potential well 30 to a region close to electrodes 4. Therefore, if moisture adheres to one or more electrodes 4 and also to the chip edges, the metal ions emanating from electrodes 4 are trapped in the potential well 30. In this manner, these metal ions do not reach the chip edges, so that formation of a leakage path is prevented. Accordingly, in a chip where the potential barrier 31 is formed according to the present invention, if intrusion of moisture or other phenomenon which would otherwise lead to a deterioration in the long-term reliability takes place, a leakage path is not created. If such a leakage path were produced, corrosion and deterioration in the characteristics of the chip would be caused. In this way, problems caused by moisture adhering to the surface of the semiconductor device can be prevented. Hence, a semiconductor device which enjoys high long term reliability can be realized.

The branch lines 22 from the aluminum interconnects 9 are disposed between the electrodes 4a at a high potential and the electrodes 4b of a low potential, as well as between the electrode 4 and the chip edges. These branch lines 22 form a potential barrier 31 similar to that described above. Therefore, if moisture adheres to both electrodes 4a and 4b, metal ions produced are trapped in the well 30 that is created by the potential barrier 31. Consequently, formation of a leakage path between them is prevented. Hence, corrosion and deteriorations in the characteristics of the chip can be prevented. This can enhance the long-term reliability. Similar advantages can be gained by using conductive belts for those metal interconnects of the semiconductor circuit other than the electrodes to which a high voltage is applied.

Also in the present embodiment, interconnects having belt-like cross sections, i.e. in the form of flat strips having a certain width, are used as the aluminum interconnects 9 forming the conductive belts. Therefore, the top 32 of the potential barrier 31 of a high potential created by the aluminum interconnects 9 assumes a flat shape corresponding to the width of the conductive belts. By giving the potential barrier to be surmounted by the metal ions trapped in the potential well 30 in going out of this well 30 a certain width, escape of the metal ions from the well 30 can be prevented. In this way, if metal ions come out of the electrode 4 over a long term, or if a large amount of metal ions suddenly come out, movement of the large amount of metal ions can be impeded by means of the well 30 by giving the potential barrier 31 a suitable width. This barrier is created by the conductive belts, which in turn are formed by the belt-like aluminum interconnects 9 as in the present embodiment. Therefore, the ability of the conductive belts in the present embodiment to prevent a leakage path is substantial. A semiconductor device having higher reliability can thus be produced.

In this way, in the chip 10 of the present embodiment, formation of a leakage path which would normally extend from the electrodes 4 arranged along the fringe of the chip is prevented by the conductive belts using the aluminum interconnects 9, which preferably completely surround the circuit formed on chip 10. For this purpose, it is necessary to maintain the potential on the aluminum interconnects as high as possible. In the device of this embodiment, the aluminum interconnects 9 are connected with the power supply interconnects 20 via the polysilicon layer regions 21 to maintain the high potential. These polysilicon layer regions 21 can prevent corrosion of the internal interconnects of aluminum and reduce the leakage current flowing through the aluminum interconnects 9. More specifically, the polysilicon layer regions 21 are made from the same material. i.e. silicon, as the substrate 1 and as the field oxide film 2. Therefore, the polysilicon layer regions 21 adhere well and are resistant to corrosion. If cracks permit intrusion of moisture to the aluminum interconnects 9 which are conductive belts, the polysilicon layer regions 21 can prevent the moisture from going into the circuit formed inside the substrate 1 along the aluminum interconnects 9. As such, if the aluminum interconnects 9 are corroded by moisture, progress of corrosion inside the substrate can be prevented, so that the circuit or the electrodes 4 are affected less thereby.

In addition, if a leakage path is formed from the aluminum interconnects 9 toward the interior of substrate 1, the level of current flowing through the leakage path can be suppressed, insomuch as the aluminum interconnects 9 are connected with the power supply interconnects 20 via the polysilicon layer regions 21 that have a high resistance. Therefore, even in this case, the leakage current can be reduced. This can reduce the corrosion of the aluminum interconnects 9. Also, similar advantages can be obtained by using layer regions in which an impurity is diffused instead of polysilicon layer regions 21.

The aluminum interconnects 9 also act to prevent cracks which would otherwise often originate at the edges 7 of chip 10 from reaching the inside of the circuit, such as the region of metal electrodes 4. Therefore, the aluminum interconnects 9 are disposed not only as the conductive belts but also as sacrificial electrodes. Furthermore, the interconnects prevent propagation of cracks.

In the present disclosure, a semiconductor device on which the conductive belts using the aluminum interconnects are formed has been described. The conductive belts are not restricted to aluminum interconnects and can be easily formed without involving any special machining steps by using structures which are normally used in semiconductor fabrication processes such as polysilicon or a layer in which an impurity is diffused.

It is also possible to form a plurality of potential wells, for protecting the circuit with greater certainty, by providing several spaced, parallel rows of conductive belts. The conductive belts can be applied to any semiconductor device operating at a high voltage as well as to electrodes.

As described thus far, the novel semiconductor device is characterized in that a conductive layer for creating a potential barrier is formed outside the circuit formed on a substrate, especially outside electrodes which are often disposed along the outer periphery of the circuit. The conductive layer can prevent the appearance of leakage paths which would otherwise be produced by metal ions. In this way, deterioration in the characteristics of the semiconductor device, corrosion of the electrodes, and other problems associated with the long-term reliability of the semiconductor device due to leakage paths can be prevented. As a result, a semiconductor device which is highly durable and has high reliability, especially long-term reliability, can be produced.

Also, the difficulties which would normally be caused by hairline cracks which tend to form starting from the scribed edges of a semiconductor device can be easily prevented by forming the above-described conductive layer.

In prior art semiconductor devices, a border region is provided to prevent intrusion of cracks and to modify the potential gradient between the substrate and the electrodes to which a high voltage is applied. The present invention allows the length of such a border region to be shortened. Additionally, the distance between the scribed edges and the circuits, including electrodes, formed on the substrate can be shortened. Further miniaturization of the semiconductor device is thus made possible. Moreover, metals other than precious metals can be used for the metal electrodes, since corrosion of the metal electrodes to which a high voltage is applied can be prevented by the conductive layer, or strip, according to the invention. Hence, the costs of manufacturing the semiconductor device can be reduced.

Further, there are other methods for applying potential to a conductive layer which forms a potential barrier according to the present invention.

First, it is possible to apply potential to the conductive layer from an exclusive pad outside the circuit region.

Secondly, it is possible to apply a potential which is higher than the power voltage to the conductive layer from the exclusive pad or the power provided by an internal boosting circuit.

These methods are related to the methods for applying potential to the conductive layer according to this invention. These methods can be used in combination with the other methods disclosed in the preferred embodiments, such as a method in which the conductive layer is coupled with the potential source through a high resistance in order to restrict the leakage of current from the conductive layer.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. In a semiconductor device comprising a substrate having a peripheral edge, and a semiconductor integrated circuit fabricated on the substrate so that the circuit has an outer periphery spaced inwardly of the peripheral edge of the substrate, the improvement comprising a conductive layer extending along at least a part of the outer periphery of the circuit and between the outer periphery of the circuit and peripheral edge of the substrate, and supply means connected for applying a potential to said conductive layer and a potential to said substrate to create at said conductive layer a potential barrier maintained at a potential higher than the potential of said substrate.

2. A semiconductor device as set forth in claim 1 wherein said supply means comprise a high-voltage power supply for supplying power to said integrated circuit, and connecting means for connecting the power supply to said conductive layer.

3. A semiconductor device as set forth in claim 2 wherein said connecting means comprises nonmetallic interconnects which connect said high-voltage power supply with said conductive layer.

4. A semiconductor device as set forth in claim 2 wherein said connecting means comprises a high resistance means which connects said high-voltage power supply with said conductive layer.

5. A semiconductor device as set forth in claim 2 wherein said connecting means is a polysilicon layer formed on said substrate.

6. A semiconductor device as set forth in claim 2 wherein said connecting means is a layer which is formed on said substrate and in which an impurity is diffused.

7. A semiconductor device as set forth in claim 1 said conductive layer has the form of conductive belts.

8. A semiconductor device as set forth in claim 1 wherein said conductive layer consists of aluminum interconnects formed on said substrate.

9. A semiconductor device as set forth in claim 1 wherein said conductive layer is a polysilicon layer formed on said substrate.

10. A semiconductor device as set forth in claim 1 wherein said conductive layer is a semiconductor layer which is formed on said substrate and in which an impurity is diffused.

11. In a semiconductor device comprising a substrate having a peripheral edge, semiconductor components fabricated on the substrate the improvement comprising having a substrate, and metal electrodes formed on the substrate adjacent the peripheral edge of the substrate, the improvement comprising a conductive layer disposed close to at least some of said metal electrodes, and supply means connected for applying a potential to said conductive layer and a potential to said substrate to create at said conductive layer a potential barrier maintained at a potential higher than the potential of said substrate.

12. A semiconductor device as set forth in claim 11 wherein said conductive layer is disposed between said metal electrodes and said substrate.

13. A semiconductor device as set forth in claim 12 wherein said conductive layer is disposed between adjacent ones of said metal electrodes.

14. A semiconductor device as set forth in claim 11 wherein said supply means are further connected for applying a DC voltage said metal electrodes.

15. A semiconductor device as set forth in claim 11 wherein said supply means comprise a high-voltage power supply for supplying power to said semiconductor components, and connecting means for connecting the power supply to said conductive layer.

16. A semiconductor device as set forth in claim 15 wherein said connecting means comprises nonmetallic interconnects which connect said high-voltage power supply with said conductive layer.

17. A semiconductor device as set forth in claim 15 wherein said connecting means comprises a high resistance means which connects said high-voltage power supply with said conductive layer.

18. A semiconductor device as set forth in claim 15 wherein said connecting means is a polysilicon layer formed on said substrate.

19. A semiconductor device as set forth in claim 15 wherein said connecting means is a layer which is formed on said substrate and in which an impurity is diffused.

20. A semiconductor device as set forth in claim 11 said conductive layer has the form of conductive belts.

21. A semiconductor device as set forth in claim 11 wherein said conductive layer consists of aluminum interconnects formed on said substrate.

22. A semiconductor device as set forth in claim 11 wherein said conductive layer is a polysilicon layer formed on said substrate.

23. A semiconductor device as set forth in claim 11 wherein said conductive layer is a semiconductor layer which is formed on said substrate and in which an impurity is diffused.

24. A semiconductor device as set forth in claim 11 wherein said conductive layer is disposed between adjacent ones of said electrodes and further extends along regions located between said electrodes and said peripheral edge of said substrate.

* * * * *